United States Patent
Hu et al.

(10) Patent No.: US 11,789,057 B2
(45) Date of Patent: Oct. 17, 2023

(54) METHOD AND APPARATUS FOR ELECTRIC FIELD MEASUREMENT BASED ON A LEVITATED PARTICLE

(71) Applicants: Zhejiang Lab, Zhejiang (CN); Zhejiang University, Zhejiang (CN)

(72) Inventors: Huizhu Hu, Zhejiang (CN); Zhenhai Fu, Zhejiang (CN); Xiaowen Gao, Zhejiang (CN); Tao Liang, Zhejiang (CN); Peitong He, Zhejiang (CN); Jing Jiang, Zhejiang (CN)

(73) Assignees: Zhejiang Lab, Zhejiang (CN); Zhejiang University, Zhejiang (CN)

( * ) Notice: Subject to any disclaimer, the term of this patent is extended or adjusted under 35 U.S.C. 154(b) by 0 days.

(21) Appl. No.: 18/089,210

(22) Filed: Dec. 27, 2022

(65) Prior Publication Data

US 2023/0135076 A1 May 4, 2023

(30) Foreign Application Priority Data

Apr. 1, 2022 (CN) .......................... 202210336005.6

(51) Int. Cl.
 *G01R 29/12* (2006.01)
(52) U.S. Cl.
 CPC .................... *G01R 29/12* (2013.01)
(58) Field of Classification Search
 CPC .................................................... G01R 29/12
 USPC ........................................................ 324/457
 See application file for complete search history.

(56) References Cited

U.S. PATENT DOCUMENTS

| 2018/0246155 A1* | 8/2018 | Generazio | .......... | G01R 29/0878 |
| 2018/0252756 A1* | 9/2018 | Yoo | ..................... | H04N 1/00015 |

OTHER PUBLICATIONS

Galneder, R., et al. "Microelectrophoresis of a bi layer-coated silica bead in an optical trap: application to enzymology." Biophysical Journal 80.5 (2001): 2298-2309. (Year: 2001).*

Stapfner, Sebastian, et al. "Cavity nano-optomechanics: a nanomechanical system in a high finesse optical cavity." Quantum Optics. vol. 7727. SPIE, 2010. (Year: 2010).*

(Continued)

*Primary Examiner* — Christopher P McAndrew

(57) ABSTRACT

A method for electric field measurement based on a levitated particle includes steps of (1) capturing a particle and levitating the captured particle; (2) adjusting a quantity of electric charge carried by the levitated particle; (3) measuring a charge number N of the levitated particle; (4) disposing the levitated particle in an electric field to be measured, measuring a displacement power spectral density $S_{vx}^{el}$ of the levitated particle under the electric field and obtaining an electric field force $F_{el}$; and (5) according to a formula of $E=F_{el}/Nq_e$, obtaining an electric field intensity E. An apparatus for electric field measurement based on a levitated particle includes a high-voltage DC (direct current) power supply, two bare wire electrodes, a vacuum chamber, a trapping laser, an objective lens, a pair of parallel electrodes, a collective lens, a quadrant photodetector, a lock-in amplifier, a signal generator and a power amplifier.

10 Claims, 2 Drawing Sheets

(56) References Cited

OTHER PUBLICATIONS

Bustamante, Carlos J., et al. "Optical tweezers in single-molecule biophysics." Nature Reviews Methods Primers 1.1 (2021): 25. (Year: 2021).*

Ricci, Francesco, et al. "Accurate mass measurement of a levitated nanomechanical resonator for precision force-sensing." Nano letters 19.10 (2019): 6711-6715. (Year: 2019).*

* cited by examiner

METHOD AND APPARATUS FOR ELECTRIC FIELD MEASUREMENT BASED ON A LEVITATED PARTICLE

CROSS REFERENCE OF RELATED APPLICATION

The present invention claims priority under 35 U.S.C. 119(a-d) to CN 202210336005.6, filed Apr. 1, 2022.

BACKGROUND OF THE PRESENT INVENTION

Field of Invention

The present invention relates to a method and an apparatus for electric field measurement based on a levitated particle.

Description of Related Arts

Electric field is one of the most fundamental physical quantity to describe electromagnetic field. It is widely used and of great significance in many fields. Radio frequency electric field is the basis of modern communication, and is also widely applied in remote sensing technology, physical research, medical science and other fields. In the power system, it is very important for the safe and stable operation to accurately measure the electric field around the electric equipment. The electric field is able to be used to detect "contact voltages", which is due to the ground faults in electrical equipment, and is an important environmental safety issue in many cities. In addition, with the development of modern industry, the intensity and density of radio frequency electric field are greatly increased, which will affect the behaviors of some insects and animals. Therefore, the detection of electric field, especially the precise measurement of weak electric field has practical significance.

The current methods of electric field measurement include the NV (nitrogen-vacancy) color center solid-state spin in diamond, Rydberg atoms, antenna coupled passive electronic devices and electro-optic crystal measurement method.

The antenna coupling circuit has low electric field detection sensitivity between 1 to 10 V/m/Hz$^{1/2}$; the electro-optic crystals can reach the sensitivity of 10$^{-3}$ V/m/Hz$^{1/2}$, but only one direction of the electric field can be detected; the detection sensitivity of the NV color center in diamond and the Rydberg atoms measurement method is related to the atomic energy level, the optimal detection frequency band is concentrated in microwave and the GHz-THz frequency band.

SUMMARY OF THE PRESENT INVENTION

In view of the deficiencies of the prior art, the present invention aims to propose a method and an apparatus for electric field measurement based on a levitated particle.

Accordingly, the present invention adopts technical solutions as follows.

A method for electric field measurement based on a levitated particle comprises steps of:
(1) capturing a particle and levitating the captured particle;
(2) adjusting a quantity of electric charge carried by the levitated particle;
(3) measuring a charge number N of the levitated particle;
(4) placing the levitated particle in an electric field to be measured, measuring a displacement power spectral density (PSD) $S_{vx}^{el}$ of the levitated particle under the electric field to be measured, and obtaining an electric field force $F_{el}$; and
(5) according to a formula of $E=F_{el}/Nq_e$, obtaining an electric field intensity E, wherein $q_e$ is a quantity of electric charge of a single charge.

Preferably, the particle is a standard optical uniform dielectric sphere with known mass, spherical in shape and made from silica.

Preferably, in the step (1), the captured particle is levitated by optical levitation, magnetic levitation or electrical levitation.

Preferably, in the step (2), the quantity of electric charge carried by the levitated particle is adjusted by ultraviolet excitation or high-voltage corona discharge.

Preferably, in the step (3), measuring the charge number N of the levitated particle comprises forming an alternating electric field by applying an alternating driving voltage with a frequency $\omega_{dr}$ to a pair of parallel electrodes, wherein the levitated particle is located within a range of the alternating electric field; and obtaining a response amplitude of the levitated particle to the alternating electric field by demodulating a response signal with the frequency $\omega_{dr}$, so that the charge number N of the levitated particle is obtained according to the response amplitude.

Preferably, in the step (1), the captured particle is levitated by optical levitation, wherein a sensitivity of electric field measurement is optimal at a resonant frequency, a theoretical sensitivity $S_{min}^{Eth}$ is determined by a thermal noise limit and the charge number N, which is expressed by a formula of $$S_{min}^{Eth} = \frac{\sqrt{2k_B Tm\Gamma}}{Nq_e},$$

here, $k_B$ is a Boltzmann constant, T is a Kelvin temperature, m is a mass of the levitated particle, $\Gamma$ is a damping rate and $q_e$ is the quantity of electric charge of a single charge.

Preferably, in the step (4), three electric field components in three axis directions are detected respectively by orthogonally decomposing motion of the levitated particle, and then are superimposed, so as to realize the measurement of the electric field.

Preferably, a size of the particle is in the order of one hundred nanometers, the vibration amplitude thereof is several nanometers, and a spatial resolution of the electric field to be measured is in the order of one hundred nanometers.

Also, the present invention provides an apparatus, for implementing the method of electric field measurement based on the levitated particle. The apparatus comprises a high-voltage DC (direct current) power supply, two bare wire electrodes, a vacuum chamber, a trapping laser, an objective lens, a pair of parallel electrodes, a collective lens, a quadrant photodetector, a lock-in amplifier, a signal generator and a power amplifier, wherein:

the high-voltage DC power supply, the trapping laser, the quadrant photodetector, the lock-in amplifier, the signal generator and the power amplifier are placed outside the vacuum chamber;

the bare wire electrodes, the objective lens, the pair of parallel electrodes and the collective lens are placed within the vacuum chamber;

a particle is disposed between the pair of parallel electrodes, and between the objective lens and the collective lens;

the objective lens is arranged opposite to the collective lens;

a connection line between a center of the objective lens and a center of the collective lens intersects a connection line between centers of the pair of parallel electrodes;

the quadrant photodetector is connected with the lock-in amplifier;

the signal generator generates a resonance signal, the resonance signal is applied to the pair of parallel electrodes by the power amplifier to form an alternating electric field;

a trapping laser beam is incident into the vacuum chamber and is focused through the objective lens to form a trapping optical field, so as to capture the particle in the vacuum chamber;

the high-voltage DC power supply performs corona discharge in the vacuum chamber through the bare wire electrodes, so as to control the quantity of electric charge carried by the particle;

a scattered light is formed by the trapping laser beam penetration through the particle, the scattered light is emitted to an outside of the vacuum chamber through the collective lens and is collected by the quadrant photodetector;

the quadrant photodetector transmits a collected light signal to the lock-in amplifier; and the lock-in amplifier determines an electric field intensity of a position of the particle according to the collected light signal.

Preferably, a cross section of the vacuum chamber is circular, a chamber wall corresponding to a position of the trapping laser has a first chamber port, the chamber wall corresponding to a position of the quadrant photodetector has a second chamber port, the trapping laser beam is incident into the vacuum chamber through the first chamber port, the scatter light passes through the collective lens and then is emitted to the outside of the vacuum chamber through the second chamber port, one of the pair of parallel electrodes is connected with the signal generator through the power amplifier, another of the pair of parallel electrodes is connected to ground at the outside of the vacuum chamber.

The present invention has some beneficial effects as follows.

Based on the levitated charged particle, the present invention provides a method and an apparatus for measuring a vector electric field with high sensitivity, high spatial and temporal resolution, low frequency band and wide spectrum.

By applying the alternating electric field to the charged particle levitated in the optical trap, the displacement PSD and mechanical detection sensitivity spectrum are obtained, so that the electric field intensity of the position of the levitated particle can be measured. The higher the sensitivity of mechanical detection, the higher the sensitivity of electric field detection. The high sensitivity of electric field detection and the high spatial resolution of nanometer scale are able to be achieved with the help of the high sensitivity of mechanical detection of the optical levitation harmonic oscillator and the nano-sized levitated particle. The electric field intensity in the DC-MHz range is able to be detected by using the charged particle levitated in the optical trap, which is able to achieve high time resolution and low frequency and wide spectrum detection performance. Moreover, by decomposing the motion of the particle, the electric field intensity in three orthogonal directions is able to be obtained respectively, so as to realize the vector detection of electric field.

Figure 1:
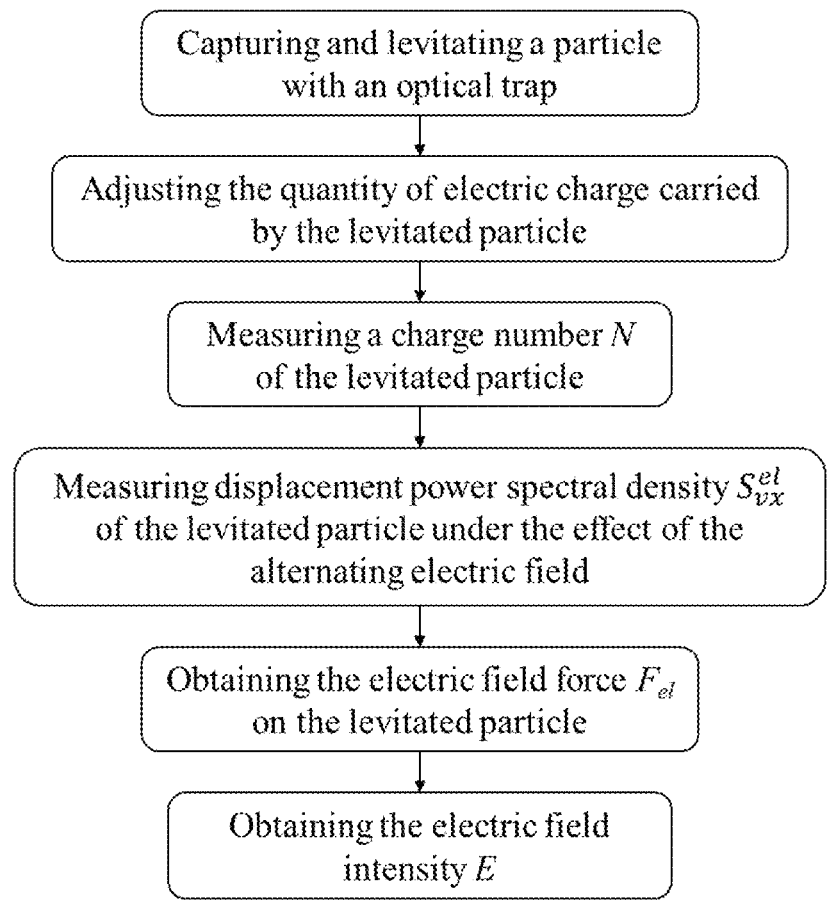
FIG. 1 is a flow chart of a method for electric field measurement based on a levitated particle provided by the present invention.

In the drawings, 1: high-voltage DC power supply; 2: bare wire electrode; 3: vacuum chamber; 4: trapping laser; 5: objective lens; 6: particle; 7: parallel electrodes; 8: collective lens; 9: quadrant photodetector; 10: lock-in amplifier; 11: signal generator; 12: power amplifier; 13: first chamber port; 14: second chamber port.

DETAILED DESCRIPTION OF THE PREFERRED EMBODIMENT

The present invention is further explained in detail with drawings and embodiments as follows.

Referring to FIG. 1, a method for alternating electric field measurement based on a levitated particle according to a preferred embodiment of the present invention is illustrated, wherein the method comprises steps of:

(1) capturing a particle and levitating the captured particle with an optical trap in a vacuum chamber;

(2) charging the levitated particle with a certain amount of charges by high-voltage corona discharge, wherein a quantity of electric charge carried by the levitated particle is able to be adjusted through performing high-voltage corona discharge for several times;

(3) applying an alternating electric field through parallel electrodes, demodulating a response signal of the levitated particle at a frequency of the alternating electric field, and measuring a charge number of the levitated particle according to an amplitude of the response signal;

(4) placing the levitated particle in an electric field to be measured, obtaining an electric field force by detecting a displacement PSD of the levitated particle under an effect of the electric field to be measured; and (5) obtaining an electric field intensity of a position of the levitated particle, according to the quantity of electric charge carried by the levitated particle.

The particle is an optical uniform dielectric sphere with a nominal diameter of 150 nm, spherical in shape and made from silica.

The high-voltage corona discharge utilizes the bare wire electrodes to apply a high-voltage signal of about 1 kV to the air in the vacuum chamber for generating plasma during the corona discharge process; and then electrons and positive ions in the plasma are reversely separated under an effect of the high voltage signal and adsorbed on a surface of the levitated particle, thereby changing the quantity of electric charge carried by the levitated particle. The high-voltage corona discharge is stopped by removing the high-voltage signal, and the quantity of electric charge carried by the levitated particle is maintained stably. By performing high-voltage corona discharge for several times, the quantity of electric charge carried by the levitated particle is able to be adjusted.

The pair of parallel electrodes are two steel needles placed horizontally with a distance of 2.5 mm, wherein one of the pair of parallel electrodes is connected with a sinusoidal signal after power amplification, and another of the pair of parallel electrodes is grounded.

Figure 2:
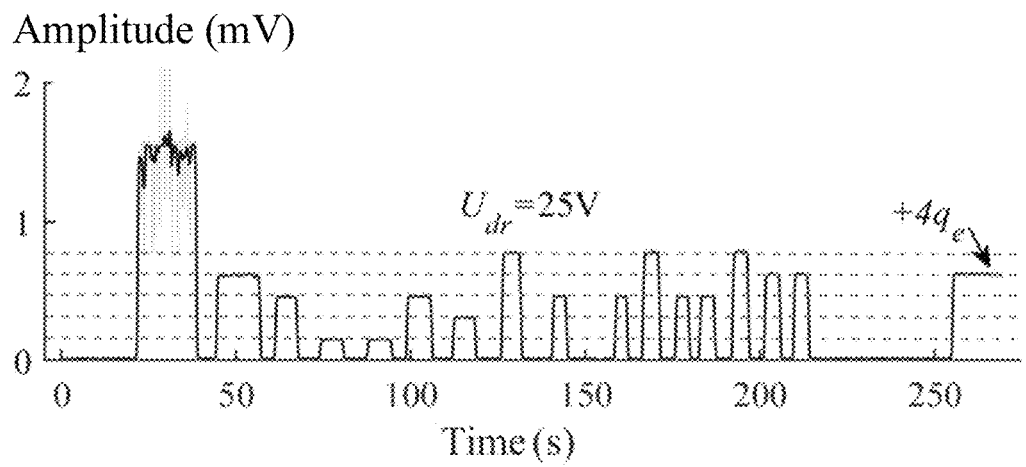
FIG. 2 shows a control process of the quantity of electric charge carried by the particle.

The step (3) specifically comprises forming the alternating electric field by applying a driving voltage with a frequency ωd, to the pair of parallel electrodes, demodulating the response signal at cod, by a lock-in amplifier, obtaining a step-like amplitude signal after several discharge processes (as shown in FIG. 2), wherein a minimum difference between steps is a magnitude response caused by a single charge $q_e$, and obtaining the charge number N of the levitated particle based on the minimum difference; in FIG. 2, a response signal in the X-axis direction at the driving voltage with the frequency $\omega_{dr}$ is extracted, the minimum difference between steps is caused by the single charge $q_e$, the quantity of electric charge carried by the levitated particle varies between 0 and $5q_e$ during several discharge processes, and finally the quantity of electric charge carried by the levitated particle is $4q_e$.

Figure 3:
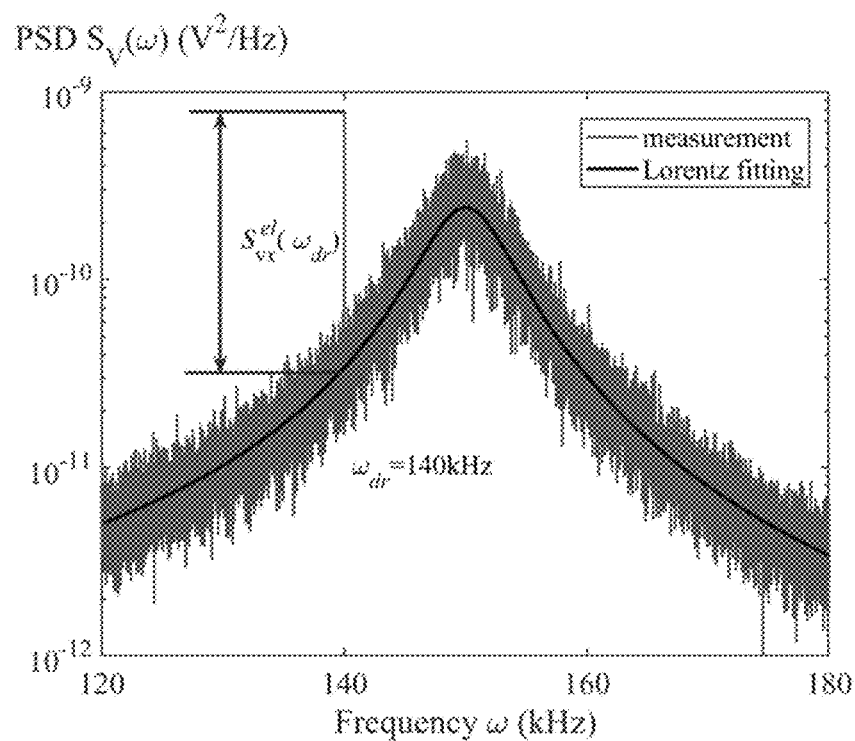
FIG. 3 shows the displacement power spectral density in the X-axis direction under the electric field.

Assuming that the above-mentioned parallel electrodes are placed in an x-axis direction (which is perpendicular to the direction of laser axis in horizontal), and a voltage signal with an amplitude $U_{dr}$ and a frequency ωd, is applied to the pair of parallel electrodes, an alternating electric field will be generated and cover the position of the levitated particle. The alternating electric field comprises three quadrature components for generating driving responses on displacement signals of the levitated particle in three axis directions respectively. Taking the x-axis as an example, driven by an electric field a displacement power spectral density (PSD) $S_{vx}^{el}(\omega_{dr})$ of the levitated particle at the driving frequency $\omega_{dr}$ in the x-axis direction is measured, and then according to Langevin equation, the electric field force $F_{el-x}$ on the levitated particle in the X-axis direction is further obtained. The amplitude of the electric field force is proportional to the quantity of electric charge carried by the levitated particle, then the electric field intensity in the X-axis direction is obtained by using the PSD at the driving frequency $\omega_{dr}$, which is expressed by a formula of $E_x=F_{el-x}/Nq_e$, wherein N is the charge number of the levitated particle, $q_e$ is the quantity of electric charge of a single charge. As shown in FIG. 3, a frequency $\omega_{dr}$ near the resonant frequency is selected, and then the driving response $S_{vx}^{el}(\omega_{dr})$ at $\omega_{dr}$ is measured, and then the electric field component at $\omega_{dr}$ is calculated. The electric field components in other two directions are calculated by the same method.

For an optically levitated harmonic oscillator, the electric field force is able to be regarded as an external force with general characteristics, and its theoretical force detection sensitivity is able to be obtained by thermal noise force detection sensitivity, namely, $S_{min}^{Fth}=\sqrt{2k_BTm\Gamma}$, wherein $k_B$ is the Boltzmann constant, T is the Kelvin temperature, m is the mass of the levitated particle, and F is the damping rate. By the linear relationship between the electric field force, the electric field intensity and the quantity of electric charge, the theoretical sensitivity of electric field detection for thermal noise limit is able to be directly obtained, namely, $$S_{min}^{Eth} = \frac{\sqrt{2k_BTm\Gamma}}{Nq_e}.$$

The size of the levitated particle is in the order of 100 nanometers, the vibration amplitude in the optical trap is in the order of nanometers, so the electric field measurement method provided by the present invention is able to obtain high spatial resolution in the order of 100 nanometers.

According to the electric field measurement method provided by the present invention, a vector electric field at the position of the levitated particle is able to be obtained by vector addition of the electric field components in the three axis directions.

As shown in FIG. 2, the response signal of the X-axis at the driving voltage with the frequency $\omega_{dr}$ is extracted by the lock-in amplifier, the minimum difference between steps is the magnitude response caused by the single charge $q_e$, the quantity of electric charge carried by the levitated particle varies with several discharge processes, and becomes $4q_e$ after 250 seconds.

FIG. 3 shows the displacement power spectral density of the X-axis under the electric field to be measured at 10 mbar. The quantity of electric charge carried by the levitated particle is $4q_e$, the amplitude $U_{dr}$ of the driving voltage is 5 V, the driving frequency ωd, is 140 kHz. It is able to be seen from FIG. 3 that the spike at 140 kHz is the response caused by the electric field to be measured, so the electric field measurement in X-axis direction is able to be realized with the calculation of $S_{vx}^{el}(\omega_{dr})$.

Figure 4:
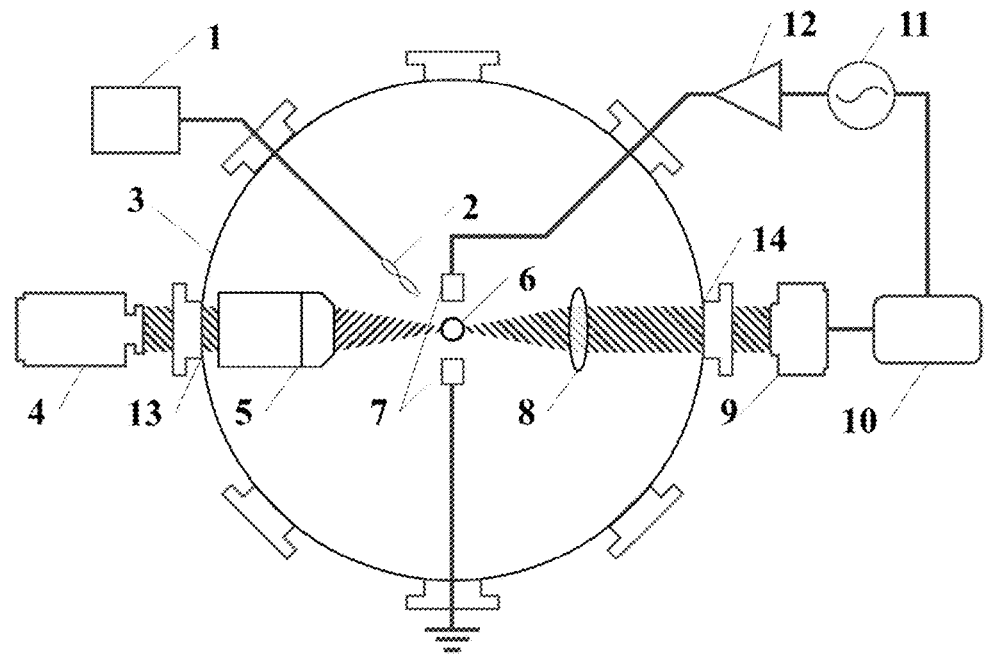
FIG. 4 is a structurally schematic diagram of an apparatus for electric field measurement based on a levitated particle provided by the present invention.

Referring to FIG. 4, an apparatus is illustrated for implementing the method of the alternating electric field measurement based on the levitation particle, which is mentioned above. The apparatus comprises a high-voltage DC (direct current) power supply 1, two bare wire electrodes 2, a vacuum chamber 3, a trapping laser 4, an objective lens 5, a pair of parallel electrodes 7, a collective lens 8, a quadrant photodetector 9, a lock-in amplifier 10, a signal generator 11, a power amplifier 12, a first chamber port 13 and a second chamber port 14, wherein the high-voltage DC power supply 1, the trapping laser 4, the quadrant photodetector 9, the lock-in amplifier 10, the signal generator 11 and the power amplifier 12 are placed outside the vacuum chamber 3; the bare wire electrodes 2, the objective lens 5, the pair of parallel electrodes 7 and the collective lens 8 are placed within the vacuum chamber 3; a particle 6 is disposed between the pair of parallel electrodes 7, and between the objective lens 5 and the collective lens 8; the objective lens 5 is arranged opposite to the collective lens 8; a connection line between a center of the objective lens 5 and a center of the collective lens 8 intersects a connection line between centers of the pair of parallel electrodes 7; the quadrant photodetector 9 is connected with the lock-in amplifier 10; the signal generator 11 generates a resonance signal, the resonance signal is applied to the pair of parallel electrodes 7 by the power amplifier 12 to form an alternating electric field; the trapping laser 4 emits a trapping laser beam, which is incident into the vacuum chamber 3 and is focused through the objective lens 5 to form a trapping light field, so as to capture the particle 6 in the vacuum chamber 3; the high-voltage DC power supply 1 performs corona discharge in the vacuum chamber 3 through the bare wire electrodes 2, so as to control a quantity of electric charge carried by the particle 6; a scattered light is formed by the trapping laser beam penetration through the particle 6, the scattered light is emitted to the outside of the vacuum chamber 3 through the collective lens 8 and is collected by the quadrant photodetector 9; the quadrant photodetector 9 transmits a collected light signal to the lock-in amplifier 10; and the lock-in amplifier 10 determines an electric field intensity of a position of the particle 6 according to the collected light signal.

A cross section of the vacuum chamber 3 is circular, a chamber wall corresponding to a position of the trapping laser 4 has a first chamber port 13, the chamber wall corresponding to a position of the quadrant photodetector 9 has a second chamber port 14, the trapping laser beam is incident into the vacuum chamber 3 through the first chamber port 13, the scatter light passes through the collective lens 8 and then is emitted to the outside of the vacuum chamber 3 through the second chamber port 14, one of the pair of parallel electrodes 7 is connected with the signal generator 11 through the power amplifier 12, another of the pair of parallel electrodes 7 is connected to ground at the outside of the vacuum chamber 3.

First Application Sample

A specific example of the method for electric field measurement provided by the present invention is described as below.

The trapping laser 4 is a 1064 nm single-mode laser. The particle 6 to be captured is a silica microsphere with a nominal diameter of 150 nm. The high-voltage DC power supply 1 is for outputting a 1 kV voltage. The bare wire electrodes 2 are enameled wires whose insulating sheath is removed at an end to expose a conductor part. The pair of parallel electrodes 7 are two steel needles placed horizontally with a distance of 2.5 mm. The power amplifier 12 is for outputting 50× amplified sinusoidal signal. The z-axis is set as the direction of the laser axis, and the x-axis is set as the horizontal direction perpendicular to the laser axis.

The method comprises steps of:

(A) forming a stable trapping light field by switching on the 1064 nm single-mode laser, spraying the silica microspheres into the vacuum chamber, and capturing one levitated particle by the trapping light field;

(B) obtaining a voltage-displacement conversion coefficient $c_x$, a resonant frequency $\omega_x$ and a damping rate $\Gamma_x$ by Lorentzian fitting the power spectral density without applying the driving voltage;

(C) switching on the high-voltage DC power supply for 2 s, and charging the levitated particle by performing corona discharge at the end of the enameled wires;

(D) generating the driving voltage by the signal generator, wherein the frequency $\omega_{dr}$ is selected to be close to $\omega_x$ for accuracy improvement, and obtaining the alternating electric field by applying the driving voltage to the pair of parallel electrodes with the power amplifier;

(E) extracting the response signal of the X-axis at the driving voltage with the frequency $\omega_{dr}$ by the lock-in amplifier, wherein the quantity of electric charge carried by the levitated particle is able to be changed through several discharge processes; the minimum difference between steps is able to be determined, and finally the quantity of electric charge is $4q_e$; and (F) determining the motion power spectral density of the levitated particle under the electric field by the lock-in amplifier, wherein FIG. 3 shows the displacement PSD in the X-axis direction at 10 mbar, the quantity of electric charge carried by the levitated particle is $4q_e$, the amplitude $U_{dr}$ of the driving voltage is 5 V, the frequency $\omega_{dr}$ is 140 kHz, the displacement PSD is $Se_{vx}^{el}(\omega_{dr})=7.602\times10^{-10}$ V²/Hz; according to the parameters obtained by the step (B), the electric field force $F_{el\_x}$ of the levitated particle in the X-axis direction is $F_{el\_x}=1.8573$ N; according to the quantity of electric charge of the levitated particle, the electric field intensity $E_x$ of the position of the levitated particle in the X-axis direction is $$E_x = \frac{F_{el-x}}{c_x N q_e} = 212.531 \text{ V}/m.$$

Second Application Sample

The electric field detection sensitivity of the present invention is explained with a specific sample as below.

The number of charge carried by the levitated particle is adjusted to N=59. Through the force detection sensitivity of thermal noise limit, namely, $S_{min}^{Fth}=\sqrt{2k_BTm\Gamma}$, and the linear relationship between the electric field force and the electric field intensity and the quantity of electric charge, the electric field detection sensitivity of thermal noise limit, namely, the theoretical detection sensitivity, is able to be directly obtained, wherein $k_B$ is the Boltzmann constant, T is the Kelvin temperature, m is the mass of the levitated particle, and $\Gamma$ is the damping rate. For the above particle, at 0.01 mbar, T=431±87 K, $\Gamma_x$=19.8±2.1 Hz, m=2.988 fg, the electric field detection sensitivity $$S_{min}^{Eth} = \frac{\sqrt{2k_BTm\Gamma}}{Nq_e} = 0.2225 \text{ V}/m/\sqrt{\text{Hz}}.$$

According to the above analysis, the better electric field detection sensitivity is able to be achieved by improving the force detection sensitivity of thermal noise limit and increasing the number of charge carried by the levitated particle. At the air pressure of $2.4\times10^{-6}$ mbar, through feedback cooling, the force detection sensitivity of thermal noise limit at the resonant frequency is able to reach $4.39\times10^{-20}$ N/Hz$^{1/2}$, while it is in the order of $10^{-17}$ N/Hz$^{1/2}$ at the non-resonant frequency. For the levitated particle with charge number N=59, the theoretical electric field detection sensitivity reaches the order of $10^{-3}$ V/m/Hz$^{1/2}$, and the actual detection sensitivity reaches the order of 1 V/m/Hz$^{1/2}$.

Third Application Sample

The method for electric field measurement provided by the present invention is able to be applied to an electromagnetic levitation oscillator system.

A magnetic trap of an electromagnetic levitation oscillator system comprises two Sm—Co permanent magnets and four iron cobalt alloy magnetic poles, so as to form a three-dimensional potential well to stably trap the diamagnetic particle. The poles are made of metal, so they are able to act as electrodes to apply electric field. The structure of the electromagnetic levitation oscillator system is the same as that shown in FIG. 4. The pair of parallel electrodes 7 are also able to apply an electric field while generating a magnetic trap. The trapping laser 4 is a 660 nm single-mode laser. The particle 6 to be captured is a borosilicate glass microsphere with a nominal diameter of 60 μm. The high-voltage DC power supply 1 is for outputting a 1 kV voltage. The bare wire electrodes 2 are enameled wires with insulating sheath removed at the end to expose the conductor part. The power amplifier 12 is for outputting 50× amplified sinusoidal signal. The z-axis is set as the direction of the laser axis, and the x-axis is set as the horizontal direction perpendicular to the laser axis.

The method comprises steps of:
(A) putting the borosilicate glass microsphere into the vacuum chamber, and capturing the levitated particle by the magnetic trap;
(B) obtaining a detection optical path in the vacuum chamber by switching on the 660 nm single-mode laser;
(C) obtaining a voltage-displacement conversion coefficient $c_x$, a resonant frequency $\omega_x$ and a damping rate $\Gamma_x$ by Lorentzian fitting the power spectral density without applying the driving voltage;
(D) switching on the high-voltage DC power supply for 2 s, and charging the levitated particle by performing corona discharge at the end of the enameled wires;
(E) generating the driving voltage by the signal generator, wherein the frequency $\omega_{dr}$ is selected to be close to $\omega_x$, and obtaining the alternating electric field in the X-axis direction by applying the driving voltage to the magnetic poles with the power amplifier;
(F) extracting the response signal of the X-axis at the driving voltage with the frequency $\omega_{dr}$ by the lock-in amplifier, wherein the quantity of electric charge carried by the levitated particle is able to be changed through several discharge processes, and finally the quantity of electric charge is $5q_e$; and
(G) through the electromagnetic levitation oscillator, at $1.333 \times 10^{-7}$ mbar, obtaining the acceleration detection sensitivity of $3.6 \times 10^{-8}$ g/Hz$^{1/2}$; when the mass of the levitated particle is $2.5 \times 10^{-10}$ kg, obtaining the force detection sensitivity of $9 \times 10^{-18}$ N/Hz$^{1/2}$. As for the levitated particle with N=59, the electric field detection sensitivity reaches the order of 0.95 V/m/Hz$^{1/2}$.

Fourth Application Sample

The vector electric field at the position of the levitated particle is able to be detected by vector addition of the electric fields in three axis directions. Due to the small size of the levitated particle, the spatial resolution of electric field detection is in the order of nanoscale. Multiple particles are able to be levitated by the array multi-optical trapping technology, that is, holographic optical tweezers, which is able to realize multi-site vector electric field detection. High resolution detection of spatial distribution of electric field is able to be achieved by manipulating multiple particles with holographic optical tweezers.

Finally, it should be noted that the above examples and explanations are intended only to illustrate the technical solutions of the present invention and not the limitation to the present invention. Those skilled in the art should understand that any modification or equivalent substitution of the present invention which is not out of the spirit and scope of the disclosure of the technical solution shall fall within the protective scope of the claims of the present invention.

What is claimed is:

1. A method for electric field measurement based on a levitated particle, the method comprising steps of:
   (1) capturing a particle and levitating the captured particle with an optical trap in a vacuum chamber;
   (2) adjusting a quantity of electric charge carried by the levitated particle;
   (3) measuring a charge number N of the levitated particle;
   (4) disposing the levitated particle in an electric field to be measured, measuring a displacement power spectral density $S_{vx}^{el}$ of the levitated particle under the electric field to be measured and obtaining an electric field force $F_{el}$; and
   (5) according to a formula of $E = F_{el}/Nq_e$, obtaining an electric field intensity E, wherein $q_e$ is a quantity of electric charge of a single charge.

2. The method according to claim 1, wherein the particle is a standard optical uniform dielectric sphere with known mass, spherical in shape and made from silica.

3. The method according to claim 1, wherein in the step (1), the captured particle is levitated by optical levitation, magnetic levitation or electrical levitation.

4. The method according to claim 1, wherein in the step (2), the quantity of electric charge carried by the levitated particle is adjusted by ultraviolet excitation or high-voltage corona discharge.

5. The method according to claim 4, wherein in the step (3), measuring the charge number N of the levitated particle comprises forming an alternating electric field by applying an alternating driving voltage with a frequency $\omega_{dr}$ to a pair of parallel electrodes, wherein the particle is levitated within the alternating electric field; and obtaining a response amplitude of the levitated particle to an electric field force by demodulating the response signal with the frequency $\omega_{dr}$, so that the charge number N of the levitated particle is obtained according to the response amplitude.

6. The method according to claim 5, wherein in the step (1), the captured particle is levitated by optical levitation, wherein a sensitivity of electric field measurement at a resonant frequency of a harmonic oscillator $S_{min}^{Eth}$ is determined by a thermal noise limit and the number of charge N, which is expressed by a formula of $$S_{min}^{Eth} = \frac{\sqrt{2k_B T m \Gamma}}{Nq_e},$$

here, $k_B$ is Boltzmann constant, T is Kelvin temperature, m is mass of the levitated particle, and $\Gamma$ is damping rate.

7. The method according to claim 6, wherein in the step (4), three electric field components in three axis directions are detected respectively by orthogonally decomposing motion of the levitated particle, and then are superimposed, so as to realize the electric field measurement.

8. The method according to claim 7, wherein a size of the particle is one hundred nanoscale, the vibration amplitude thereof is several nanometers, and a spatial resolution of the electric field to be measured one hundred nanoscale.

9. An apparatus for implementing the method of electric field measurement based on the levitated particle according to claim 1, the apparatus comprising:
   a DC power supply, two bare wire electrodes, a vacuum chamber, a trapping laser, an objective lens, a pair of parallel electrodes, a collective lens, a quadrant photodetector, a lock-in amplifier, a signal generator and a power amplifier, wherein:
   the DC power supply, the trapping laser, the quadrant photodetector, the lock-in amplifier, the signal generator and the power amplifier are placed outside the vacuum chamber;
   the bare wire electrodes, the objective lens, the pair of parallel electrodes and the collective lens are placed within the vacuum chamber;
   a particle is disposed between the pair of parallel electrodes, and between the objective lens and the collective lens;
   the objective lens is arranged opposite to the collective lens;

a connection line between a center of the objective lens and a center of the collective lens intersects a connection line between centers of the pair of parallel electrodes;

the quadrant photodetector is connected with the lock-in amplifier;

the signal generator generates a resonance signal, the resonance signal is applied to the pair of parallel electrodes by the power amplifier to form an alternating electric field;

the trapping laser emits a trapping laser beam, which is incident into the vacuum chamber and is focused through the objective lens to form a trapping light field, so as to capture the particle in the vacuum chamber;

the DC power supply performs corona discharge in the vacuum chamber through the bare wire electrodes, so as to control the quantity of electric charge carried by the particle;

a scattered light is formed by the trapping laser beam penetration through the particle, the scattered light is emitted to the outside of the vacuum chamber through the collective lens and is collected by the quadrant photodetector;

the quadrant photodetector transmits a collected light signal to the lock-in amplifier; and the lock-in amplifier determines an electric field intensity of a position of the particle according to the collected light signal.

10. The device according to claim 9, wherein a cross section of the vacuum chamber is circular, a chamber wall corresponding to a position of the trapping laser has a first chamber port, the chamber wall corresponding to a position of the quadrant photodetector has a second chamber port, the trapping laser beam is incident into the vacuum chamber through the first chamber port, a scatter light passes through the collective lens and then is emitted to the outside of the vacuum chamber through the second chamber port, one of the pair of parallel electrodes is connected with the signal generator through the power amplifier, another of the pair of parallel electrodes is connected to ground at the outside of the vacuum chamber.

* * * * *